United States Patent
Cash et al.

(10) Patent No.: US 8,988,877 B2
(45) Date of Patent: Mar. 24, 2015

(54) AUTOMATIC COUPLING OF INDEPENDENT COOLING REGIONS DURING FAN MAINTENANCE

(75) Inventors: Kevin M. Cash, Cary, NC (US); David J. Jensen, Raleigh, NC (US); Jared E. Schott, Durham, NC (US); Brian A. Trumbo, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 599 days.

(21) Appl. No.: 13/334,274

(22) Filed: Dec. 22, 2011

(65) Prior Publication Data

US 2013/0160984 A1    Jun. 27, 2013

(51) Int. Cl.
*F28F 27/00* (2006.01)
*G06F 1/20* (2006.01)
*H05K 7/20* (2006.01)

(52) U.S. Cl.
CPC .............. *G06F 1/20* (2013.01); *H05K 7/20572* (2013.01); *F28F 27/00* (2013.01); *H05K 7/20618* (2013.01); *H05K 7/20736* (2013.01)
USPC ......... 361/688; 361/679.5; 361/692; 361/695

(58) Field of Classification Search
CPC .......... H05K 7/20572; H05K 7/20618; H05K 7/20736; F28F 27/00
USPC ............... 361/679.47–679.51, 688, 692, 695; 165/200
See application file for complete search history.

(56) References Cited

U.S. PATENT DOCUMENTS

| | | | | |
|---|---|---|---|---|
| 4,648,007 A | * | 3/1987 | Garner | 361/695 |
| 4,756,473 A | * | 7/1988 | Takemae et al. | 236/49.3 |
| 5,436,827 A | * | 7/1995 | Gunn et al. | 700/82 |
| 6,164,369 A | * | 12/2000 | Stoller | 165/104.33 |
| 6,808,411 B2 | * | 10/2004 | Chen | 439/485 |
| 6,814,546 B2 | | 11/2004 | Sekiguchi | |
| 7,116,238 B2 | * | 10/2006 | Nishimura et al. | 340/635 |
| 7,247,089 B2 | * | 7/2007 | Crippen et al. | 454/184 |
| 7,593,225 B2 | * | 9/2009 | Sasagawa et al. | 361/695 |

(Continued)

FOREIGN PATENT DOCUMENTS

| | | |
|---|---|---|
| JP | 2005026713 A | 1/2005 |
| JP | 2010267841 A | 11/2010 |

OTHER PUBLICATIONS

Matsuoka et al., "Electronic Equipment" JP2005026713 (A), Jan. 27, 2005, English Abstract, 1 page.

(Continued)

*Primary Examiner* — Anatoly Vortman
*Assistant Examiner* — Jacob Crum
(74) *Attorney, Agent, or Firm* — Katherine S. Brown; Jeffrey L. Streets (57) ABSTRACT

In a computer system, airflow through first and second cooling regions are normally separated by a chassis wall, and are independently controlled by respective first and second fan modules. The internal chassis wall includes a bypass opening that is normally blocked by the second fan module. In response to removal of the second fan module, the bypass opening is unblocked, to fluidly couple the two cooling regions. A redundant fan module is optionally included in fluid communication with the first cooling region, to either generate airflow through the first cooling region in response to failure or removal of the first fan module, or to supplement the airflow capacity of the first fan module in response to removal of the second fan module.

8 Claims, 7 Drawing Sheets

(56) References Cited

U.S. PATENT DOCUMENTS

| | | | |
|---|---|---|---|
| 7,751,186 B2* | 7/2010 | Moss et al. | 361/679.49 |
| 2002/0044421 A1* | 4/2002 | Cheng | 361/687 |
| 2007/0274039 A1* | 11/2007 | Hamlin | 361/695 |
| 2008/0212273 A1 | 9/2008 | Bechtolsheim | |
| 2008/0266790 A1 | 10/2008 | Belady et al. | |
| 2010/0172078 A1 | 7/2010 | Tanaka et al. | |
| 2011/0063778 A1 | 3/2011 | Brouillard | |

OTHER PUBLICATIONS

Takanashi et al., "Cooling Unit, Cooling Structure, and Method of Constructing Cooling System" JP2010267841 (A), Nov. 25, 2010, English Abstract, 1 page.

Yunho Hwang et al., "Performance Measurements of a Forced Convection Air-Cooled Rack", 2004, 2004 Inter Society Conference on Thermal Phenomena, pp. 194-198.

* cited by examiner

AUTOMATIC COUPLING OF INDEPENDENT COOLING REGIONS DURING FAN MAINTENANCE

BACKGROUND

1. Field of the Invention

The present invention relates to cooling computer systems, and more particularly to controlling airflow through a computer system chassis.

2. Background of the Related Art

Modern computer systems are typically modular, allowing individual hardware components to be removed and replaced with the same or other hardware components conforming to a particular standard. Even personal computers, such as laptop and desktop systems, have modular hardware devices like modular hard drives, optical drives, and system memory, along with modular fans for cooling these other heat-generating hardware devices. The larger, rack-mounted systems used in commercial applications may include many pieces of modular computer equipment mounted on racks, such as servers, power modules, network connectivity modules, and blower modules. The modular construction of rack-mounted systems makes them scalable, which allows a system to be custom-configured to achieve any size, power, and performance requirement for a given application. A rack-mounted system may use a multi-tiered cooling system that includes a computer-room air conditioning unit, along with server-level and chassis-level cooling fans and blower modules.

Moving parts in a computer can experience a greater rate of wear and a higher incidence of failure as compared with solid-state parts having no moving parts. The bearings and other moving parts used in cooling fans, for example, may lead to occasional fan replacement, and the increased incidence of failure of individual fans may limit a system's overall reliability. One method to compensate for the decreased reliability of fans is to include redundant fans. However, the use of redundant fans can add to the system's bill of materials cost, increase the cooling system complexity, and increase power consumption and power budgeting.

BRIEF SUMMARY

A cooling method is disclosed, wherein airflow is generated through a first cooling region of a chassis using a first installed fan module and airflow through a second cooling region of the computer chassis is independently generated using a second installed fan module. The first and second cooling regions are automatically coupled in response to a removal of the second fan module from the chassis. With the second fan module removed, airflow is generated through the coupled first and second cooling regions using the first fan module.

An air-cooled computer system is also disclosed, which includes a chassis having first and second cooling regions. A chassis wall separates the first cooling region from the second cooling region. However, the chassis wall has a bypass opening along the chassis wall. A first fan bay is in fluid communication with the first cooling region and a second fan bay is in fluid communication with the second cooling region. A first fan module is removably positionable in the first fan bay for generating airflow through the first cooling region, and a second fan module is removably positionable in an installed position in the second fan bay for generating airflow through the second cooling region. A backflow damper is biased toward a closed position to close off the second fan bay when there is no fan module in the second fan bay. When the second fan module is in the installed position, the second fan module opens the backflow damper and blocks the bypass opening.

A computer cooling system is further disclosed. The computer cooling system includes a chassis having first and second cooling regions separated by a chassis wall. A bypass opening is provided along the chassis wall. A first fan bay is in fluid communication with the first cooling region, and a second fan bay is in fluid communication with the second cooling region. A first fan module is removably positionable in the first fan bay, and a second fan module is removably positionable in the second fan bay. When the second fan module is in the installed position within the second fan bay, the second fan module blocks the bypass opening along the chassis wall.

DETAILED DESCRIPTION

In a computer system with at least two cooling regions independently cooled by different fan modules, the cooling regions are automatically coupled in response to removal of one of the fan modules. The automatic coupling of the two cooling regions allows airflow to both cooling regions to be maintained even when one fan module has been removed, such as for maintenance or repair. The automatic coupling of two or more cooling regions allows the different cooling regions to be continuously cooled despite the failure, removal, or absence of any one of the fan modules.

One example embodiment discussed below is a computer system having first and second cooling regions. A first fan module is provided for generating airflow through the first region, and a second fan module is provided for generating airflow through the second cooling region. The airflow through the first cooling region and the airflow through the second cooling region are normally separated by a chassis wall. However, the internal chassis wall separating the first and second cooling regions includes a bypass opening. The bypass opening is normally blocked by the presence of the second fan module, to keep the airflow through these two different cooling regions separate. The bypass opening is unblocked in response to a removal of the second fan module, to automatically couple the two airflow regions. A backflow damper in a fan bay of the second fan module is automatically closed in response to removal of the second fan module, to prevent the recirculation of warm air into the chassis.

The fan modules may also be hot-swappable, to allow for a potentially continuous, uninterrupted operation of system components when either the first or second fan modules have been removed, such as during a fan maintenance operation. A single redundant fan module is optionally provided in fluid communication with the first cooling region. The redundant fan module is normally operated in a reduced power state corresponding to the fan module's lowest speed setting, to supplement the airflow generated by the first fan module. When the second fan module is removed, the speed setting of the redundant fan module is automatically increased, to help provide sufficient airflow to the fluidly coupled first and second cooling regions. The redundant fan module may also be used as backup for the first fan module in the event that the first fan module fails. However, the first and second fan module may each include at least two fans in series, for further redundancy, such that a complete failure of one of the two fan modules is very unlikely. The unique configuration of the system and the system chassis eliminates the need to include a redundant fan module for each cooling region, which reduces the bill of materials cost for a computer system. This also increases the overall system reliability, by allowing individual fan modules to be removed and replaced while the system remains operational. The disclosed system and method also allow for a lower system power consumption as well as lower power budgeting requirements, since there are fewer fan modules that need to be allocated power.

Figure 1:
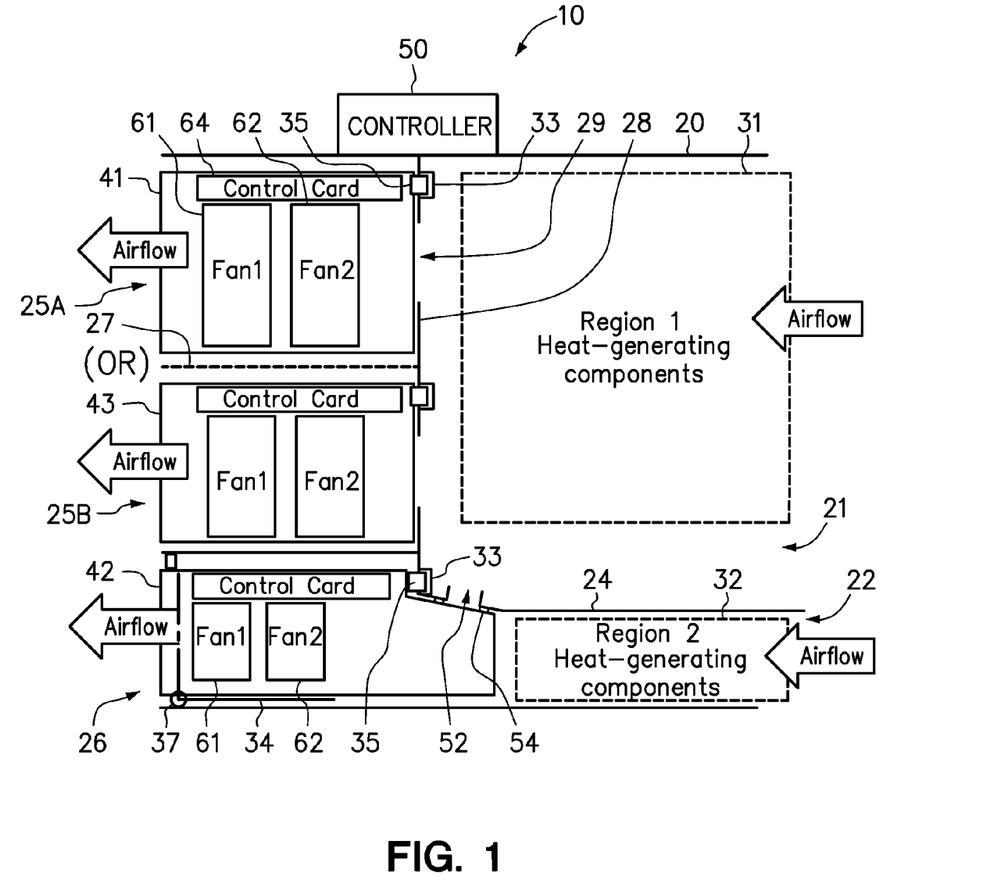
FIG. 1 is a schematic diagram of an air-cooled computer system divided into independent cooling regions.
Figure 2:
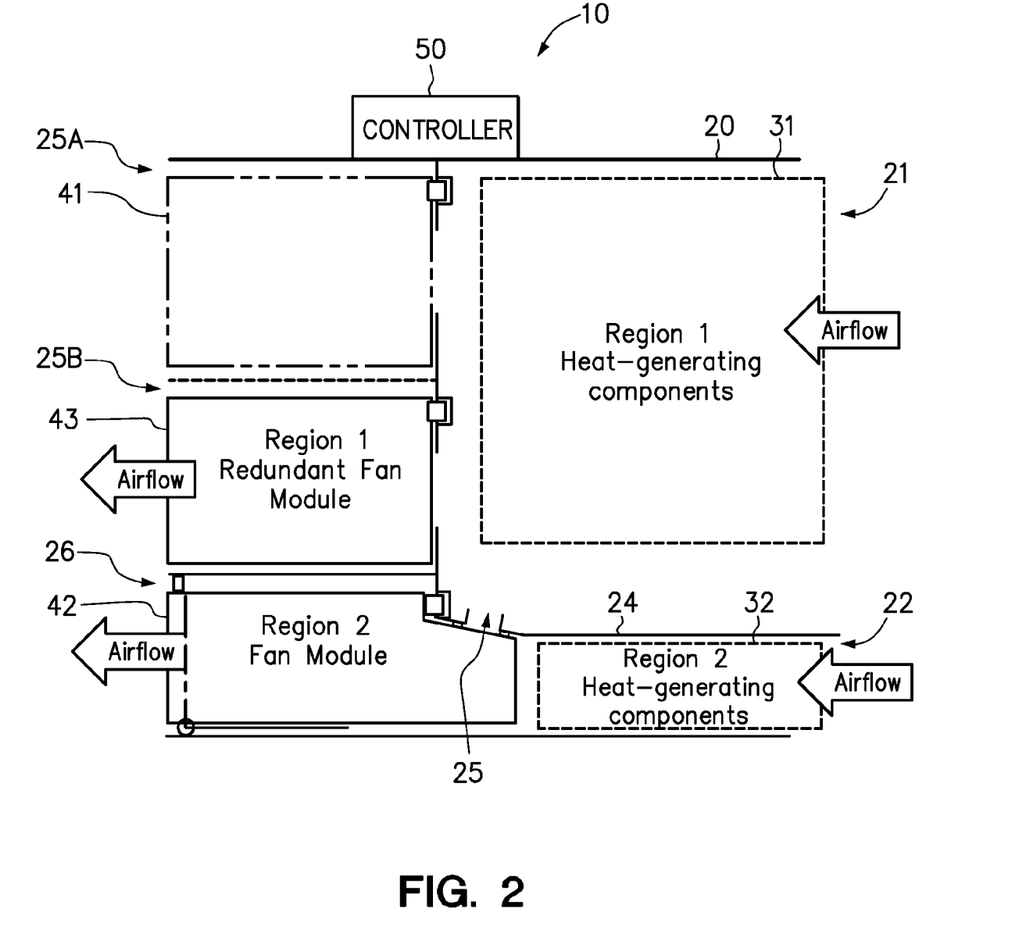
FIG. 2 is a schematic diagram of the air-cooled computer system in the event of a failure of the first fan module.
Figure 3:
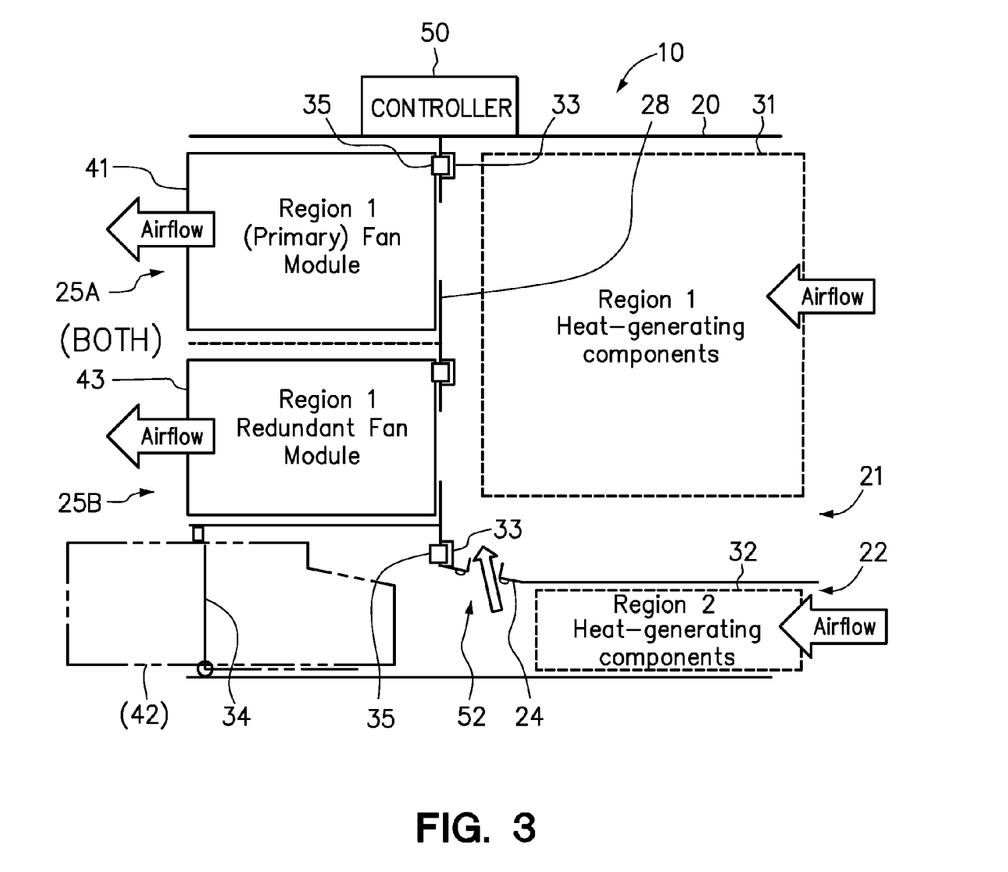
FIG. 3 is a schematic diagram of the computer system with the second fan module having been removed to couple the separate airflow regions.
Figure 4:
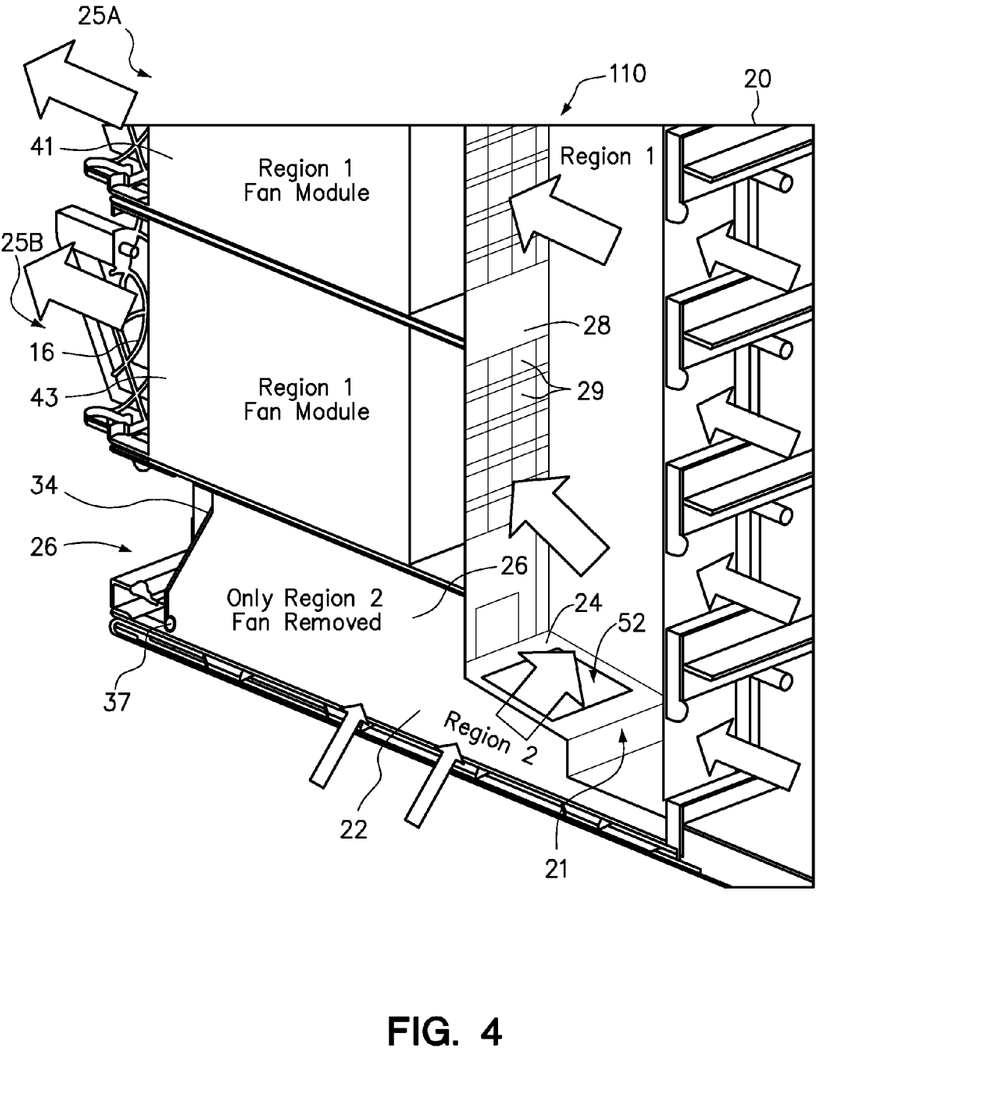
FIG. 4 is a perspective view of a particular example implementation of the computer system generally shown and described in FIGS. 1-3.
Figure 5:
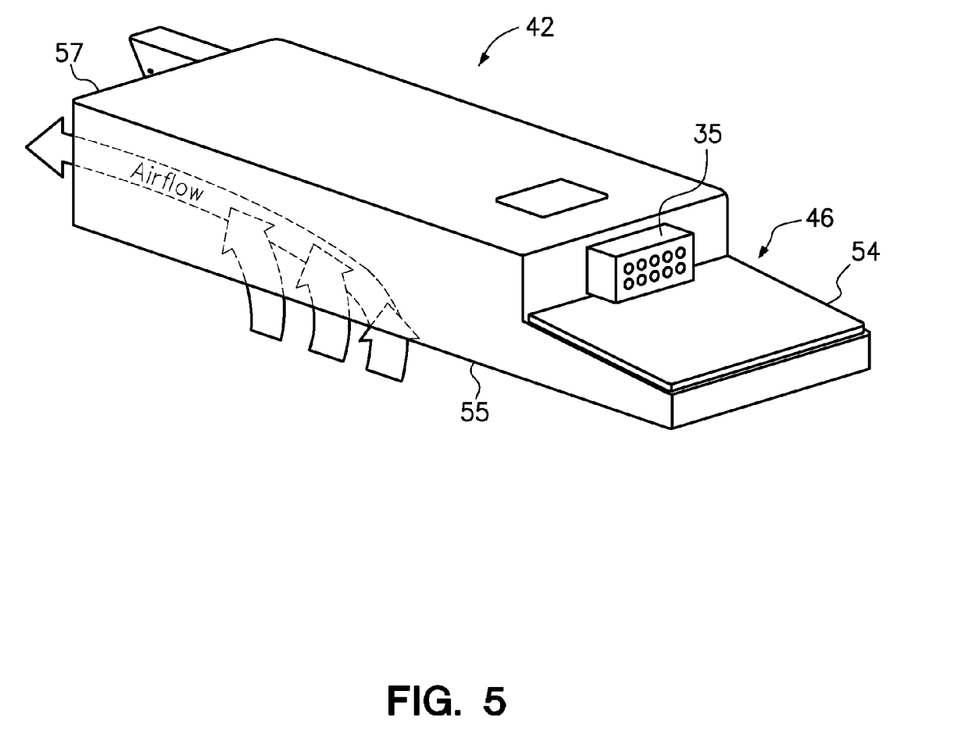
FIG. 5 is a perspective view of the second fan module as configured for use with the specific chassis geometry of FIG. 4.
Figure 6:
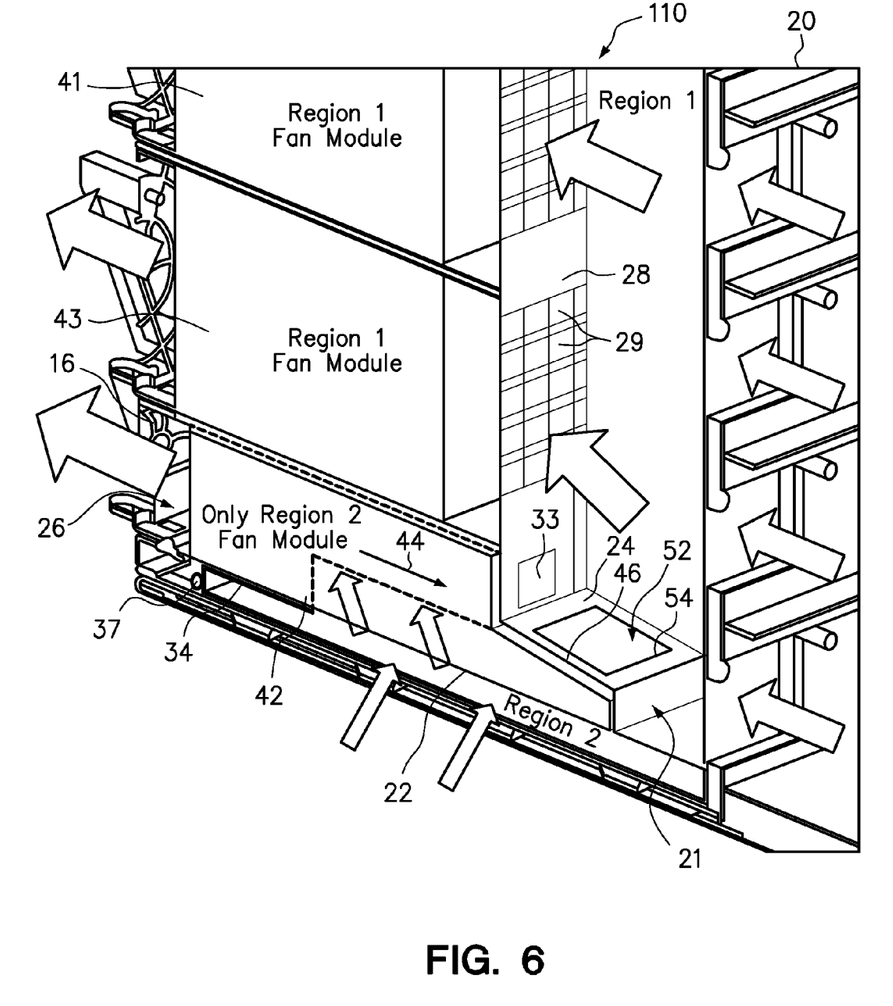
FIG. 6 is a perspective view of the air-cooled computer system of FIG. 4 with the second fan module of FIG. 5 now inserted into an installed position within the chassis.

As an overview, FIGS. 1 to 3 present schematic diagrams of an air-cooled computer system 10 in different operational states. The schematic diagrams in FIGS. 1-3 are not to scale, and broadly introduce selected features without being limited to a particular geometry. FIGS. 4-6 then present a particular example embodiment of an air-cooled computer system, including an example of optional geometry and further structural details.

Referring first to FIG. 1, the computer system 10 includes a chassis 20 that provides independently-controlled airflow to heat-generating components in different cooling regions. The computer system 10 may be a server and the chassis 20 may be a server chassis, for example. The two independently-cooled cooling regions 21, 22 are separated by a wall 24. A first set of heat-generating components 31 is in the first cooling region 21, and a second set of heat-generating components 32 is in the second cooling region 22. A first fan bay 25 is optionally divided into separate sub-bays individually referenced at 25A, 25B, each of which is in fluid communication with the first cooling region 21. These sub-bays 25A, 25B house a first fan module 41 and an optional redundant fan module 43 in this embodiment. A second fan bay 26 is in fluid communication with the second cooling region 22 and houses a second fan module 42. The two sub-bays 25A, 25B are separated by a wall 27, but both sub-bays 25A, 25B are normally in fluid communication with the first cooling region 21 and not the second cooling region 22.

Normally, the first fan module 41 and the redundant fan module 43 generate airflow through the first cooling region 21 to cool the first set of components 21 and the second fan module 42 generates airflow through the second cooling region 22 to cool the second set of components 32. The redundant fan module 43 is normally in a reduced power state corresponding to its lowest speed setting, to supplement the airflow generated by the first fan module 41. The speed setting and corresponding airflow rate of the redundant fan module 43 is selectively increased on an as-needed basis in response to various contingencies described below. In an alternative configuration, the redundant fan module 43 could normally be powered off or in a standby mode and powered on in response to the various contingencies.

All three fan modules 41-43 are shown as being modular, in that these fan modules may be individually removed from the chassis 20 for service. Features of the chassis 20 are provided to guide the insertion and removal of the fan modules 41-43, so that the fan modules 41-43 can only be installed in a particular angular orientation. The two optional sub-bays 25A, 25B closely conform to the exterior shape of the respective fan modules 41, 43 to help guide their insertion and removal. The second fan bay 26 closely conforms to the exterior shape of the second fan module 42, helping to guide the insertion and removal of the second fan module 42. Alternatively, tracks, rails, or other guide features may be provided on the chassis 20 to guide the insertion and removal of the fan modules 41-43 in a particular location.

Each fan module 41-43 includes at least two on-board fans 61, 62, a control card 64, and an electrical connector 35 (The fans 61, 62 and control card 64 are selected for illustration in FIG. 1, only). According to the modular design of the fan modules 41-43, the fans 61, 62, control card 64, and electrical connector 35 included with each fan module are all part of the same unit, and are removed and inserted together when the respective fan module 41, 42, or 43 is removed or inserted in the chassis 20. In each fan module 41-43, the control card 64 is in electronic communication with the two fans 61, 62 and the connector 35. The control card 64 may include a programmable system on chip (PSOC). The controller 50 may also include a PSOC (not shown) for communicating with the PSOC on each control card 64. The inclusion of at least two fans 61, 62 per fan module provides redundancy within each fan module 41, 42, and 43. If one of the two fans 61, 62 fails, an alert may be generated in the control card 64 and communicated to the controller 50 over an inter-integrated (I2C) bus for the attention of a system operator. A timer may be initiated in conjunction with the alert, and the system 10 at least partially shut down in response to an expiration of a time threshold, if the condition is not corrected. A failure of both fans 61, 62 simultaneously is unlikely, so the particular fan module 41, 42, or 43 will usually continue to provide sufficient airflow until the fan module 41, 42, or 43 can be replaced.

The second fan bay 26 in this embodiment includes a backflow damper 34. The backflow damper 34 is biased toward a closed position by a spring element 37. The backflow damper 34 is urged to an open position in response to insertion of the second fan module 42 into the chassis 20 against the biasing action of the spring element 37. The backflow damper 34 is moved to the closed position by the spring element 37 in response to removal of the second fan module 42. Depending upon the orientation of the server, the backflow dampers might close under the force of gravity such that a spring is not necessary. In FIG. 1, all three fan modules 41-43 are in installed positions. Although not shown in this embodiment, a similar backflow damper could also be included with each of the two sub-bays 25A, 25B.

A bypass opening 52 is provided along the wall 24 separating the first and second cooling regions 21, 22. The second fan module 42 blocks the bypass opening 52 when the second fan module 42 is in the installed position, as shown in FIG. 1, to maintain separate airflow in the two cooling regions 21, 22. A sealing member 54 is positioned at the bypass opening 52. The sealing member 54 may be formed of any pliable or elastomeric material suitable for sealing. The sealing member 54 in this embodiment is a continuous rectangular patch of gasket material carried on the second fan module 42. Alternatively, the sealing member 54 may comprise an elastomeric O-ring, or other suitable sealing member initially secured to the wall 24 about the opening. By blocking the bypass opening 52 to separate the airflow through the two cooling regions 21, 22, the first fan module 41 and redundant fan module 43 may generate all the airflow through the first cooling region 21, while the second fan module 42 may independently generate airflow through the second cooling region 22.

A connector panel 28 in the chassis 20 provides an electronic interface for connecting the controller 50 with the fan modules 41-43, such as over an I2C bus. The connector panel 28 extends along the first cooling region 21 and into the second cooling region 22. An electrical connector 33 is provided on the connector panel 28 for each of the fan modules 41-43. Each connector 33 on the connector panel 28 is aligned for connecting with the respective connector 35 when the fan modules are moved to installed positions within the chassis 20. The guide features in the fan bays 25A, 25B, 26 precisely guide the fan modules 41-43 into connection at the connector panel 28 when a user slides the fan modules 41-43 into the chassis 20, so that the fan modules 41-43 may be blind-docked. The wall 24 that separates the first and second cooling regions 21, 22 extends to the connector panel 28. The connector panel 28 has apertures 29 to allow airflow generated by the fan modules 41-43 to pass from the cooling regions 21, 22 into the respective fan bays 25A, 25B, 26.

The controller 50 orchestrates the operation of the three fan modules 41-43, including contingency responses to various events that may arise, such as a removed or missing fan module, the failure of one of the two fans 61, 62 in a fan module, or in very rare cases, the failure of both fans 61, 62. The controller 50 may selectively power on either or both of the first fan module 41 and the redundant fan module 43 to generate airflow through the first cooling region 21. With all three fan modules 41-43 installed and working properly as shown in FIG. 1, the first fan module 41, redundant fan module 43, and second fan module 42 will be powered on by default, with the redundant fan module 43 in a reduced power state corresponding to a low speed setting. The first fan module 41 and redundant fan module 43 will generate airflow through the first cooling region 21 to cool the first set of components 31, and the second fan module 42 will generate airflow through the second cooling region 22 to cool the second set of components 32. The speed of the first fan module 41 may be modulated to control the airflow rate through the first cooling region 21, and the speed of the second fan module 42 may be modulated to control the airflow through the second cooling region 22, as needed. The redundant fan module 43 may be kept in the lowest speed setting, unless and until a higher speed setting is needed.

FIG. 2 is a schematic diagram of the air-cooled computer system 10 in the event of a removal of the first fan module 41 (an outline of the first fan module 41 is still shown for reference). The controller 50 senses the removal and automatically increases the speed setting on the redundant fan module 43, to increase the airflow rate provided by the redundant fan module 43 in an amount that at least partially compensates for the removal of the first fan module 42. The redundant fan module 43, alone, generates sufficient airflow through the first cooling region 21 to cool the first set of components 31. The redundant fan 43 may continue to be operated at the higher speed setting until the controller 50 detects that a properly functioning fan module is once again in the installed position in the first sub-bay 25A. In response to the re-insertion of a fan module in the first sub-bay 25A, the controller 50 powers on that fan module and automatically reduces the power state of the redundant fan module 43.

FIG. 2 provides one example of how the computer system 10 provides reduced downtime and increased reliability of the computer system 10. Having the power state of the redundant fan 43 automatically increased in response to a removal of the first fan module 41 ensures continued sufficient airflow through the first cooling region 21. The first fan module 41 may be removed and replaced without having to power off the first set of heat-generating components 31. Meanwhile, due to the separation of airflow through the two cooling regions 21, 22, the second fan module 42 may continue to operate to cool the second set of components 32.

FIG. 3 is a schematic diagram of the computer system 10 with the second fan module 42 having been removed from the second fan bay 26 to couple the separate airflow regions 21, 22. (An outline of the second fan module 42 in the process of being removed is shown for reference.) The first fan module 41 and redundant fan module 43 are still in their respective installed positions within the chassis 20. The second fan module 42 may have been removed, for example, in response to failure or schedule maintenance of the second fan module 42. The backflow damper 43 in the second fan bay 26 has automatically moved to the closed position in response to removal of the second fan module 42, to prevent appreciable backflow or recirculation of heated air into the second fan bay 26.

The removal of the second fan module 42 also unblocks the bypass opening 52, which fluidly couples the first and second cooling regions 21, 22. This allows air to flow through bypass opening 52 in the wall 24 to the two sub-bays 25A, 25B, as driven by the first fan module 41 and redundant fan module 43. The airflow through the first cooling region 21, generated by the first fan module 41 and redundant fan module 43 generates a vacuum or negative pressure at the bypass opening 52. The vacuum or negative pressure draws airflow through the second cooling region 22. Thus, airflow continues to be generated to both the first and second cooling regions 21, 22, to cool the first and second sets of heat-generating components 31, 32.

The controller 50 senses the removal of the second fan module 42 by virtue of the disconnection of the connector 35 on the second fan module 42 from the respective connector 33 on the connector panel 28. In response, the controller 50 automatically increases the speed setting on the redundant fan module 43, while the first fan module 41 is already in a powered on state. Having both the first fan module 41 and the redundant fan module 43 still powered on simultaneously and with the redundant fan module 43 now at an increased speed setting increases the airflow at the first fan bay 25, to help compensate for the removal of the second fan module 42 from the second fan bay 26 and ensure sufficient airflow to both of the cooling regions 21, 22.

The system 10 may continue to be operated indefinitely with the second fan module 42 removed. However, in the illustrated configuration, the system 10 is preferably not operated indefinitely without the two sub-bays 25A, 25B having an installed fan module. An alert timer may therefore be initiated by the controller 50 in response to a detected removal of the first fan module 41 or the redundant fan module 43 while the system 10 is still powered on. If an operator briefly removes the first fan module 41 or the redundant fan module 43 before expiration of a predefined time threshold, the system 10 may remain powered on. However, the controller 50 may automatically power off the system 10 to avoid overheating if the time threshold expires before working fan modules are again reinstalled in the two sub-bays 25A, 25B.

It should be noted that the redundant fan module 43 is not necessary to the feature of automatically coupling the first and second cooling regions 21, 22. Even in an embodiment with only the two fan modules 41, 42 and without the optional redundant fan 43, the first fan module 41 may have sufficient capacity to generate airflow to the first and second cooling regions 21, 22 when they are coupled. However, the redundant fan module 43 is useful to provide supplemental airflow capacity, especially when an increased airflow is needed to compensate for the removed second fan module 42 in FIG. 3.

FIGS. 4-6 show a specific example embodiment of an air-cooled computer system 110. The computer system 110 may be a particular implementation of the computer system 10 shown in the schematic diagrams of FIGS. 1-3, but with a more specific geometry and structural feature set Like features are therefore accorded like reference numerals.

FIG. 4 is a sectioned, perspective view of the computer system with the second fan module removed from the second fan bay. The first fan module 41 is presently installed in one sub-bay 25A and the redundant fan module 43 is presently installed in the other sub-bay 25B of the chassis 20. The second fan module (see FIG. 5) is presently removed from the second fan bay 26, however, so the second fan bay 26 is currently empty. The connector panel 28 as shown here is effectively a continuation of the wall 24 separating the first and second cooling regions 21, 22. The connector panel 28 includes a plurality of the apertures 29 that allow airflow to pass directly though the connector panel 28 to the first and second fan bays 25A, 25B. The heated airflow exits the chassis 20 through a grating 16. With the second fan bay 26 being empty, the bypass opening 52 is unblocked, so that air may flow from the second cooling region 22 to the fan modules 41, 43 in the respective sub-bays 25A, 25B. The backflow damper 34 in the second fan bay 26 has been moved to a closed position by the spring 37, which prevents the intrusion of appreciable amounts of airflow back into the chassis 20 through the second fan bay 26. Thus, with no fan module installed in the second fan bay 26, all of the airflow through Region 1 and Region 2 is driven by one or both of the first fan module 41 and the redundant fan module 43. The redundant fan module 43 continues to be operated along with the first fan module 41, but is now at a higher speed setting, to further supplement the airflow generated by the first fan module 41.

FIG. 5 is a perspective view of the second fan module 42 as configured for use with the specific chassis geometry of FIG. 4. Airflow enters the fan module 42 from underneath, at a lower entrance 55, and exits at an exhaust end 57. The second fan module 42 includes a tapered or wedged portion 46, which may be toward the rear of the fan module opposite the exhaust end 57. The wedged portion 46 carries the sealing member 54. The sealing member 54 is a continuous rectangle of gasket material in this example. The electrical connector 35 included with the second fan module 42 is optionally in a rearwardly-facing direction (i.e., away from the exhaust end 57).

FIG. 6 is a sectioned perspective view of the air-cooled computer system 110 of FIG. 4 with the second fan module 42 of FIG. 5 now inserted into an installed position within the chassis 20. The second fan module 42 is constrained by the chassis 20 to move in an insertion direction 44 when being inserted into the fan bay 26, and in a direction parallel and opposite to the insertion direction 44 when being removed from the fan bay 26. In particular, the movement of the second fan module 42 is constrained by walls of the second fan bay 26 that closely conform to the second fan module 42. The second fan module 42 is at a fixed angular orientation during insertion of the second fan module, which precisely aligns the electrical connector 35 of the second fan module 42 (see FIG. 5) for connection with the respective connector 33 on the connector panel 28, so that the second fan module 42 may be blind-docked upon insertion. These constraints also guide movement of the second fan module 42 to position the sealing member 54 over the bypass opening 52.

The portion of the chassis wall 24 defining the bypass opening 52 between the first and second cooling regions 21, 22 is angled in this embodiment, to facilitate effectively blocking the bypass opening 52. The bypass opening 52 is at an acute angle with respect to the insertion direction 44. The acute angle between the bypass opening 52 and the insertion direction 44 is preferably within the range of between 30 and 45 degrees. A tapered or wedged portion 46 of the second fan module 42 is angled at the same acute angle as the bypass opening 52 (i.e. parallel to the angled portion of the wall 24), to block the bypass opening 52. The movement of the wedged rear portion 46 of the second fan module 42 into the angled portion of the wall 24 provides a normal force component between the wedged portion 46 of the second fan module 42 and the angled portion of the wall 24, for compressively engaging the sealing member 54. The acute angle of the wedged portion and chassis wall 24 provides a mechanical advantage by "wedging" the second fan module 42 into engagement with the sealing member 54 in response to insertion of the second fan module 42 to the installed position.

The backflow damper 34 in the second fan bay 26 is shown moved to an open position in response to insertion of the second fan module 42. Air flows through the first cooling region 21 as driven by one or both of the installed first fan module 41 and redundant fan module 43. Normally, the first fan module 41 would be operated with the redundant fan module 43 on its lowest speed setting, although the speed setting of the redundant fan module 43 may be increased as needed to further supplement the airflow, such as when triggered by a thermal event. Air simultaneously flows through the second cooling region 22, as driven by the installed second fan module 42. The airflow through the first cooling region 21 and the second cooling region 22 is now separate, and independently controlled by the respective fan module(s). Heated air from both the first and second cooling regions 21, 22 is exhausted from the chassis 20 through the grating 16.

Figure 7:
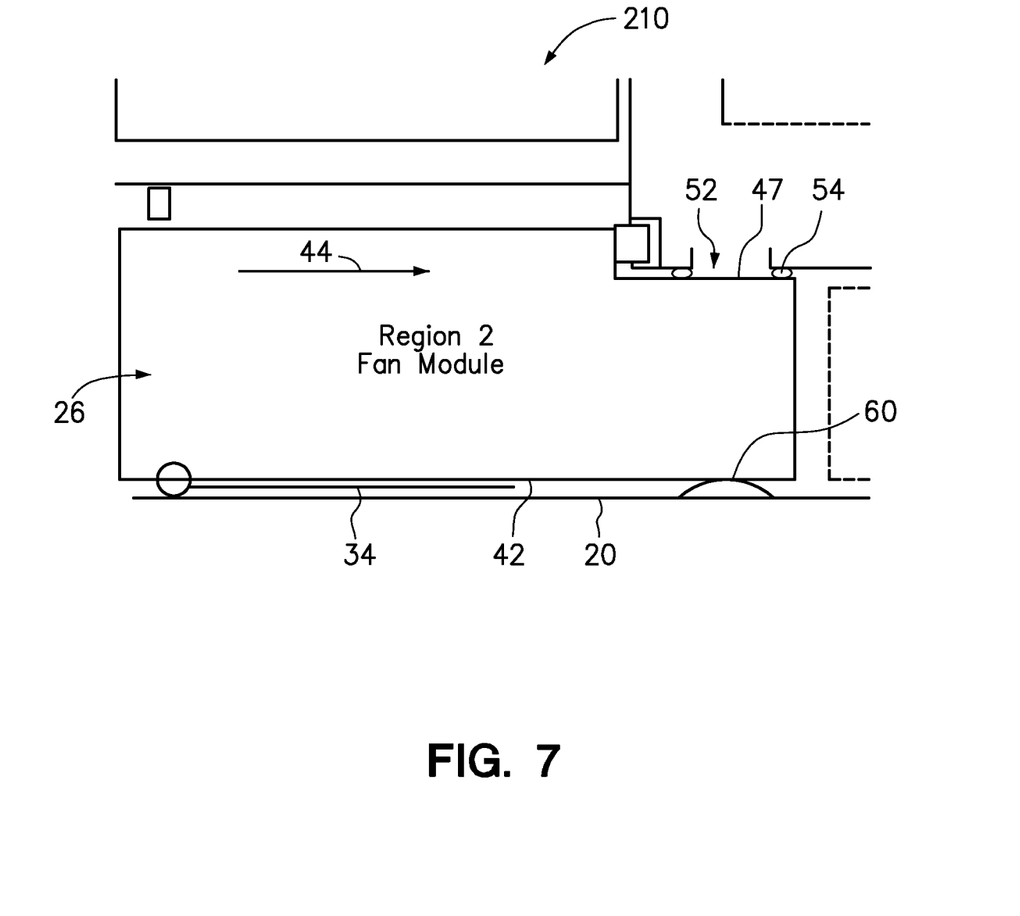
FIG. 7 is a schematic diagram of another embodiment of the air-cooled computer system having an alternative mechanism for blocking the bypass opening.

FIG. 7 is a schematic diagram of another embodiment of the air-cooled computer system 210 having an alternative sealing mechanism for blocking the bypass opening 52. The second fan module does not require a tapered or wedged portion. Rather, the second fan module 42 has a simpler, straight portion 47 that is parallel with the insertion direction 44. The sealing element 54 surrounds the bypass opening 52, and may comprise an elastomeric O-ring, gasket material, or other suitable sealing member. The second fan module 42 slides into the second fan bay 26, with the straight portion 47 sliding gently into sealing engagement against the sealing member 54, to block the bypass opening 52. A raised feature provided in the chassis 20, referred to herein as an engagement member 60, gently contacts an underside of the second fan module 42 during insertion. The engagement member 60 urges the straight portion 47 of the second fan module 42 into sealing engagement with the sealing member 54 in response to a sliding insertion of the second fan module 42 into the second fan bay 26. The arcuate (i.e. curved) profile of the engagement member 60 gives this feature a shallow angle so that the second fan module 42 easily slides against the engagement member 60, while progressively urging the straight portion 47 into engagement with the sealing member 54 as the second fan module 42 is moved to the installed position. While an arcuate profile is provided as an example, alternative shallow-angle profiles may be selected for the engagement member 60.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An air-cooled computer system, comprising:
    a chassis having first and second cooling regions and a chassis wall separating the first cooling region from the second cooling region, a bypass opening along the chassis wall, a first fan bay in fluid communication with the first cooling region, and a second fan bay in fluid communication with the second cooling region;
    a backflow damper in the second fan bay, wherein the backflow damper is biased to a closed position when the second fan bay is empty;
    a first fan module removably positionable in the first fan bay for generating airflow through the first cooling region; and
    a second fan module removably positionable in the second fan bay for generating airflow through the second cooling region, wherein the presence of the second fan module in an installed position opens the backflow damper and blocks the bypass opening to prevent airflow through the bypass opening, wherein the bypass opening is on a portion of the chassis wall that forms an acute angle with respect to an insertion direction of the second fan module into the second fan bay, wherein the second fan module includes a wedged portion matching the acute angle of the bypass opening, and wherein the second fan bay constrains the orientation of the second fan module at a fixed orientation during insertion of the second fan module to forcibly block the bypass opening with the wedged portion of the second fan module in response to positioning the second fan module in the installed position.

2. The air-cooled computer system of claim 1, further comprising:
    a first set of heat-generating components in the first cooling region upstream of the first fan bay and positioned for cooling by airflow generated by the first fan module; and
    a second set of heat-generating components in the second cooling region upstream of the second fan bay and the bypass opening, the second set of heat-generating components positioned for cooling by airflow generated by the second fan module.

3. The air-cooled computer system of claim 1, further comprising:
    a flexible sealing member positioned on the chassis wall about the bypass opening, wherein the flexible sealing member is automatically engaged by a closed surface of the second fan module in response to positioning the second fan module in the installed position.

4. The air-cooled computer system of claim 1, further comprising:
    a redundant fan module removably positionable in the chassis concurrently with the first fan module in fluid communication with the first cooling region, for driving the airflow through the first cooling region using either or both of the first fan module and the redundant fan module.

5. The air-cooled computer system of claim 4, further comprising:
    a controller including control logic for automatically increasing a speed setting on the redundant fan module in response to the first fan module being powered on when the second fan module is not in the installed position in the second fan bay.

6. The air-cooled computer system of claim 5, wherein the controller further comprises:
    control logic for reducing the speed setting on the redundant fan module in response to installing the second fan module.

7. The air-cooled computer system of claim 5, wherein the controller further comprises:
    control logic for normally operating the redundant fan module on a lowest speed setting when the second fan module is installed in the second fan bay in an operational state.

8. The air-cooled computer system of claim 1, further comprising:
    an electrical connector on each of the first fan module and the second fan module; and
    a connector panel in the chassis having electrical connectors positioned for connecting with the corresponding connectors on the first fan module and the second fan module, respectively, in response to positioning the first fan module and the second fan module in the chassis.

* * * * *